United States Patent [19]

Kim et al.

[11] Patent Number: 5,637,235

[45] Date of Patent: Jun. 10, 1997

[54] SHAPED SPIN VALVE TYPE MAGNETORESISTIVE TRANSDUCER AND METHOD FOR FABRICATING THE SAME INCORPORATING DOMAIN STABILIZATION TECHNIQUE

[75] Inventors: Young K. Kim; J. Lamar Nix, both of Boulder, Colo.

[73] Assignee: Quantum Peripherals Colorado, Inc., Louisville, Colo.

[21] Appl. No.: 664,452

[22] Filed: Jun. 17, 1996

Related U.S. Application Data

[62] Division of Ser. No. 401,553, Mar. 9, 1995.

[51] Int. Cl.[6] .................................................. B44C 1/22
[52] U.S. Cl. ........................ 216/22; 216/41; 216/66
[58] Field of Search ................................. 216/2, 33, 41, 216/66, 74, 75; 427/130, 131

[56] References Cited

U.S. PATENT DOCUMENTS

| | | |
|---|---|---|
| 5,079,035 | 1/1992 | Krounbi et al. . |
| 5,159,513 | 10/1992 | Dieny et al. . |
| 5,206,590 | 4/1993 | Dieny et al. . |
| 5,287,238 | 2/1994 | Baumgart et al. . |
| 5,301,079 | 4/1994 | Cain et al. . |
| 5,327,313 | 7/1994 | Nishioka et al. . |
| 5,329,413 | 7/1994 | Kondoh et al. . |
| 5,465,185 | 11/1995 | Heim et al. . |
| 5,485,334 | 1/1996 | Nix et al. . |
| 5,508,867 | 4/1996 | Cain et al. . |

OTHER PUBLICATIONS

Baibich, M.N., et al., "Giant Magnetoresistance of (001)Fe/(001)Cr Magnetic Superlattices," Physical Review Letters vol. 61, No. 21, pp. 2472–2475 (1988).

Dieny, B., et al., "Giant Magnetoresistance in Soft Ferromagnetic Multilayers," Physical Review B, vol. 43, No. 1, pp. 1297–1300 (1991).

O'Handley, R.C., "Giant Magnetoresistance and Spin Valves," May 14, 1994, Ch. 11, pp. 55–80.

*Primary Examiner*—William Powell
*Attorney, Agent, or Firm*—William J. Kubida; David B. Harrison; Holland & Hart LLP

[57] ABSTRACT

A magnetoresistive transducer and method for manufacturing the same includes a spin valve structure comprising a pinned, bottom ferromagnetic layer and an active, top ferromagnetic layer separated by a thin nonmagnetic metal spacer layer. The active ferromagnetic layer and underlying spacer layer are formed into a mesa structure having tapered opposing sides to promote better surface planarization in a thin film fabrication process. A pair of permanent magnet layer portions may be deposited at the end portions of the spin valve structure in a generally coplanar relationship to promote domain stabilization but may also be separated therefrom by a relatively thin separation layer. The magnetic read track width of the device can be accurately and reproducibly determined by photolithographically defining the spacing between the permanent magnet layer portions overlying the active ferromagnetic layer.

20 Claims, 9 Drawing Sheets

SHAPED SPIN VALVE TYPE MAGNETORESISTIVE TRANSDUCER AND METHOD FOR FABRICATING THE SAME INCORPORATING DOMAIN STABILIZATION TECHNIQUE

CROSS REFERENCE TO RELATED APPLICATIONS

The present application is a divisional application of copending U.S. patent application Ser. No. 08/401,553, filed Mar. 9, 1995. The present invention is related to the subject matter disclosed in U.S. patent application Ser. No. 07/975,479 to J. L. Nix et al. for "Magnetoresistive Device and Method Having Improved Barkhausen Noise Suppression" filed Nov. 12, 1992, assigned to Rocky Mountain Magnetics, Inc., assignee of the present invention, the disclosure of which is specifically incorporated herein by this reference.

BACKGROUND OF THE INVENTION

The present invention relates, in general, to the field of magnetoresistive ("MR") spin valve ("SV") devices and methods for fabricating the same. More particularly, the present invention relates to a shaped magnetoresistive spin valve device design and process for manufacturing the same for use as a magnetic transducer or "head" for reading data signals encoded on a magnetic mass storage medium.

Magnetoresistive devices or heads exhibiting so called giant magnetoresistance ("GMR") are of current technological interest in an attempt to achieve high areal density recording in magnetic computer mass storage disk drives and tapes. The GMR effect was first described by M. N. Baibich, J. M. Broto, A. Fert, F. Nguyen Van Dau, F. Petroff, P. Etienne, G. Creuzet, A. Friederich and J. Chazelas in Phys. Rev. Lett. 61, 2472 (1988). Typically, the magnitude of the magnetoresistive ratio ("$\Delta R/R$") for GMR materials exceeds that of anisotropic magnetoresistive ("AMR") materials which are currently in use as magnetic read-transducers.

The spin valve effect is one known way to utilize GMR as described by B. Dieny, V. S. Speriosu, S. S. P. Parkin, B. A. Gurney, D. R. Wilhoit and D. Mauri, Phys. Rev. B 43, 1297 (1991). A typical spin valve MR device comprises two thin ferromagnetic layers separated by a nonmagnetic metal spacer. The magnetization of one ferromagnetic layer is allowed to move freely, whereas the other one is pinned by an adjacent antiferromagnetic or permanent magnetic layer. Essential to the operation of any type of GMR structure is the fact that the MR response is a function of the angle between two magnetization vectors corresponding to the sensing field.

A number of patents have previously described various device implementations utilizing the spin valve effect. See for example U.S. Pat. No. 5,159,513 to Dieny et al. for "Magnetoresistive Sensor Based on the Spin Valve Effect" issued Oct. 27, 1992; U.S. Pat. No. 5,206,590 to Dieny et al. for "Magnetoresistive Sensor Based on the Spin Valve Effect" issued Apr. 27, 1993; U.S. Pat. No. 5,287,238 to Baumgart et al. for "Dual Spin Valve Magnetoresistive Sensor" issued Feb. 15, 1994; and U.S. Pat. No. 5,301,079 to Cain et al. for "Current Biased Magnetoresistive Spin Valve Sensor" issued Apr. 5, 1994, all assigned to International Business Machines Corporation.

The stacked, orthogonal structures of the various device implementations therein described locate a lower ferromagnetic layer (on which the freely rotating magnetization vector resides) above the substrate but below the upper ferromagnetic layer having its magnetization vector pinned by an adjacent antiferromagnetic pinning layer. Although the first listed patent indicates that the structure might be inverted, wherein the latter pinned ferromagnetic layer underlies the former freely rotating ferromagnetic layer, it nevertheless appears that it would be difficult to achieve a sufficiently high current density with the design described to provide an enhanced sensor output signal inasmuch as high resistivity materials (such as the capping layer for example) are interposed between the current leads and the top-most ferromagnetic layer. Moreover, whether inverted or not, the read track width cannot be accurately or reproducibly defined without difficulty due to the fact that both the current leads and the contiguous permanent magnet regions may effect it and precise track width definition through photolithographic processing of the relatively thick conductive layer is problematic at best. Further, precise control of the domain stabilization layer is also extremely difficult due to the relative thinness of the layers involved (on the order of less than 100 Å) and the fact that the total magnetic moment ("$M_r \cdot t$") which determines the strength of the stabilization is limited by the thickness of the contiguous permanent magnet layer. Utilizing a thicker permanent magnet layer to compensate for these shortcomings could have the unintended consequence of altering the magnetization of the pinned ferromagnetic layer.

SUMMARY OF THE PRESENT INVENTION

A benefit of the shaped spin valve type magnetoresistive transducer and method for fabricating the same of the present invention is to improve the magnetic performance of conventional spin valve devices by shaping the head structure and adding a domain stabilization scheme to suppress the Barkhausen noise which results from unstable magnetic characteristics, such as multidomain formation, within the spin valve device.

A spin valve device in accordance with the present invention includes a magnetoresistive spin valve structure comprising two thin ferromagnetic layers separated by a thin nonmagnetic metal spacer. A pair of permanent magnet layers is deposited at the end portions of the spin valve structure in a generally coplanar relationship but separated therefrom by a relatively thin separation layer. A further embodiment of a spin valve device in accordance with the present invention includes a tapering of the side portions of the active sensor layer (on which the magnetization can rotate freely) and the underlying spacer layer to promote better surface planarization in a thin film fabrication process. In accordance with the structure and method of the present invention, higher current density to the active sensor layer can be delivered from a pair of current leads due to the provision of relatively short and less resistive current paths. In a more specific fabrication process in accordance with the present invention, the magnetic read track width of the device can be accurately and reproducibly determined by photolithographically defining the spacing between the permanent magnet layer portions overlying the top ferromagnetic layer.

Broadly, what has been disclosed is a spin valve type magnetoresistive sensor incorporating active and pinned ferromagnetic layers separated by a non-magnetic spacer layer formed on a substrate having an overlying underlayer formed thereon. The improvement comprises a pinning layer formed on the underlayer, with the pinning layer underlying the pinned ferromagnetic layer. The spacer and active ferromagnetic layers overlying the pinned ferromagnetic layer are formed with tapered side portions defining a mesa-like structure. In a more specific embodiment, relatively thin separation layer portions overlie at least the tapered side portions of the mesa together with corresponding permanent magnet layer portions defining the read track width. Current may be applied to the sensor by means of a pair of current leads contacting the permanent magnet layer portions.

Also disclosed is a magnetoresistive device comprising a substrate, an underlayer overlying the substrate and a pinning layer overlying the underlayer. A first ferromagnetic layer overlies the pinning layer and a spacer layer overlies a first selected portion of the first ferromagnetic layer. The spacer layer presents a first mesa structure having opposing first and second sides thereof. A second ferromagnetic layer overlies the first mesa structure of the spacer layer, the second ferromagnetic layer also presenting a second mesa structure having opposing first and second sides thereof. First and second separation layers overly the first ferromagnetic layer contiguous with the first and second mesa structures at the first and second sides thereof. First and second permanent magnet layers overlie the first and second separation layers and a preselected portion of an upper surface of the second mesa structure adjoining the opposing first and second sides thereof. First and second conductor layers overlie a selected portion of the first and second permanent magnet layers respectively and a capping layer overlies the first and second conductor layers, the first and second permanent magnet layers and the upper surface of the second mesa structure not overlain by the permanent magnet layer.

BRIEF DESCRIPTION OF THE DRAWINGS

The foregoing and other features and objects of the present invention will become more apparent and the invention itself will be best understood by reference to the following description of a preferred embodiment taken in conjunction with the accompanying drawings, wherein.

DESCRIPTION OF A PREFERRED EMBODIMENT

Figure 1:
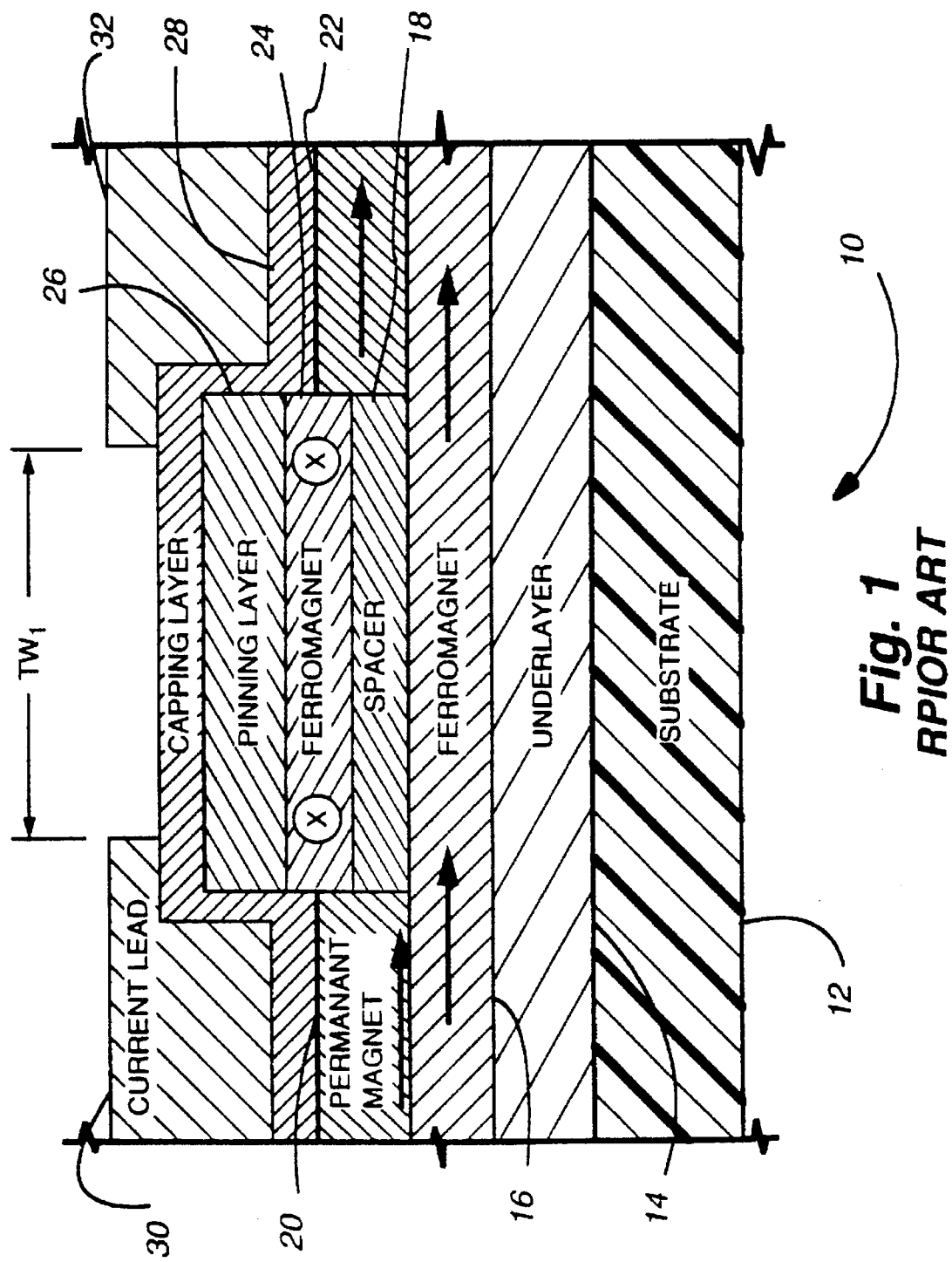
FIG. 1 is a schematic cross-sectional, air bearing surface ("ABS") view of a prior art spin valve device substantially as described in the afore-described U.S. Patents wherein the read track width "$TW_1$" is defined by the metallization of the current leads overlying the pinned, upper ferromagnetic layer.

With reference now to FIG. 1, a prior art spin valve sensor 10 structure is depicted as described and illustrated in the aforementioned U.S. Patents. The prior art spin valve sensor 10 comprises, in pertinent part, a substrate 12 having an overlying underlayer 14. The active spin valve structure itself comprises two ferromagnetic layers (formed of transition metals or alloys such as permalloy) illustrated as a lower ferromagnetic layer 16 and upper ferromagnetic layer 24 separated by a nonmagnetic spacer layer 18 (formed of a noble metal such as Cu, Ag, or Au). A pinning layer 26, which may comprise an antiferromagnet such as FeMn, is deposited on top of the upper ferromagnetic layer 24 to offer an anisotropic exchange coupling of on the order of several hundred Oersteds ("Oe"). Therefore, the direction of the magnetization of the upper ferromagnetic layer 24 is pinned with its easy axis perpendicular to the air bearing surface (ABS). Alternatively, the pinning layer 26 can be formed at the bottom of the spin valve structure as suggested by U.S. Pat. No. 5,159,513. The underlayer 14 (such as Ta) and a capping layer 28 (which may also comprise Ta) are provided to protect the active structure. Permanent magnet layers 20, 22 are formed at the sides of the substantially orthogonal, stacked structure to offer domain control on the lower ferromagnetic layer 16.

The prior art spin valve sensor 10 design presents potential disadvantages in terms of manufacturing reproducible magnetic read head products inasmuch as a considerable amount of current density is required to deliver current to the spin valve structure through the nonmagnetic pinning and capping layers 26, 28, all of which have inherently high resistivities. Further, the read track width ("$TW_1$") may not be precisely determined because the conductor (or current lead 30, 32) layers are relatively thick compared to the active magnetic sensor structures and both the current leads 30, 32 and the permanent magnet layers 20, 22 could define the track width. This is undesirable in terms of stable read head operation. Moreover, precise control of the thickness of the pair of permanent magnet layers 20, 22 for Barkhausen noise suppression purposes is very difficult due to their limited thickness scale which is only on the order of several tens of Angstroms ("Å"). For example, when a thicker permanent magnet layer 20, 22 is needed to adjust the total magnetic moment (the remnant magnetization times film thickness, $M_r \cdot t$) which, in turn, determines the strength of the stabilization, the permanent magnet layer 20, 22 thickness may become greater than the combined thickness of the spacer and upper ferromagnetic layers 18, 24. This is inherently unsatisfactory because the magnetization of the otherwise firmly pinned upper ferromagnetic layer 24 could be altered.

Figure 2:
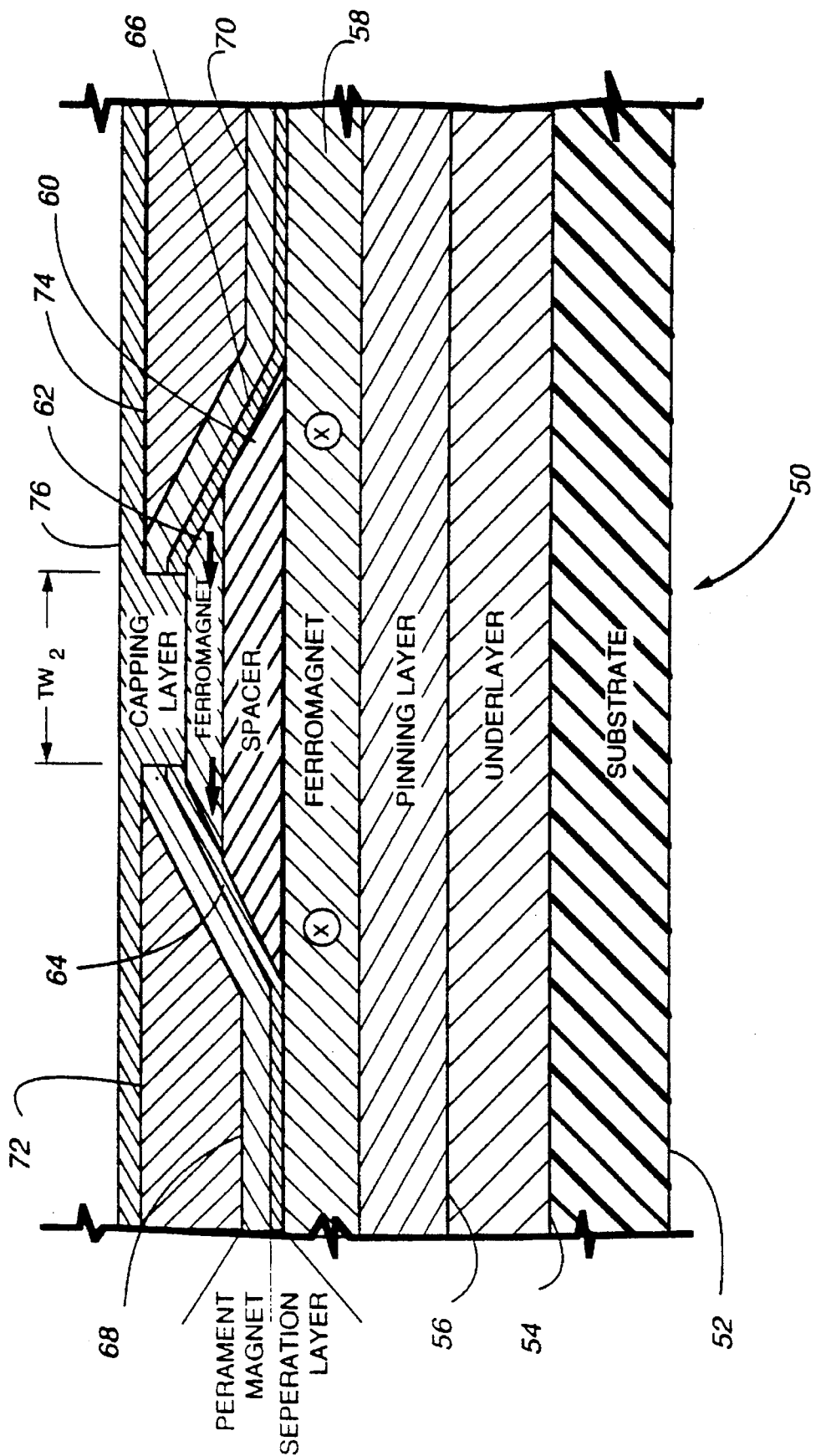
FIG. 2 is a schematic cross-sectional ABS view of a shaped spin valve device in accordance with the present invention wherein the read track width "$TW_2$" is defined by the permanent magnet layer portions overlying the top ferromagnetic layer.

With reference to FIG. 2, a representative example of a shaped spin valve sensor 50 in accordance with the present invention is shown. In the design of the shaped spin valve sensor 50, a substrate 52 has an overlying underlayer 54 formed thereon and a high resistivity pinning layer 56 is deposited prior to any of the ferromagnetic layers. Deposition of the pinning layer 56 is followed by the deposition of a thin, bottom ferromagnetic layer 58. A spacer layer 60 and a second, top ferromagnetic layer 62 are deposited next and patterned into a mesa-like structure with tapered sides. A shallow taper angle (on the order of substantially 45° or less) has been found to be advantageous in order to achieve overall smoother device topology in fabrication. The tapered side mesa structure offers relatively large area surface planarization which can be beneficial for device construction for use as magnetic write transducers. Thin non-magnetic separation layers 64, 66 (such as Cr) are deposited prior to the permanent magnet layers 68, 70 on the bottom ferromagnetic layer 58 and the sides of the mesa (as well as a portion of the upper surface of the mesa adjoining the tapered sides) to prevent exchange coupling which could result in rotating the pinned magnetization direction of the bottom ferromagnetic layer 58. The formation of current leads 72, 74 follow to make contact directly with the permanent magnet layers 68, 70. A capping layer 76 overlies the current leads 72, 74, a portion of the permanent magnet layers 68, 70 and the uncovered portion of the top ferromagnetic layer 62 forming the top of the mesa structure.

In the shaped spin valve sensor 50 of the present invention, it is the permanent magnet layers 68, 70 that define the read track width ("TW$_2$") and not the current leads 72, 74. In this manner, reproducible track width control is made possible because the permanent magnet layers 68, 70 are typically thinner than the conductor layer forming the current leads 72, 74 thereby obviating the latters' more difficult photolithographical challenges. Moreover, because current can then be delivered directly to the active, top ferromagnetic layer 62 through the permanent magnet layers 68, 70 and thin separation layers 64, 66, higher current density can be achieved than in prior art designs.

Referring additionally now to FIGS. 3–8, a representative process flow for manufacturing a shaped spin valve sensor 50 in accordance with the present invention is shown. With initial reference to FIG. 3, a substrate 80 is illustrated having an overlying underlayer 82 as shown for subsequent deposition and patterning of the spin valve structure. The spin valve structure, more fully described hereinafter, can also be directly prepared on the substrate 80 which may comprise Si, glass or Al$_2$O$_3$-TiC without the overlying underlayer 82, especially in those applications when a read-only sensor is to be formed. Alternatively, the spin valve structure can also be placed in between two soft magnetic materials called shields wherein one shield can serve as a magnetic pole for the write-transducer. Another possibility is to place the spin valve read-transducer in between the two soft magnetic materials called poles which are part of write-transducer. In the latter two instances, nonmagnetic insulating gap layers such as Al$_2$O$_3$ or SiO$_2$ may be provided between the spin valve structure and a pair of soft magnetic material films.

Figure 3:
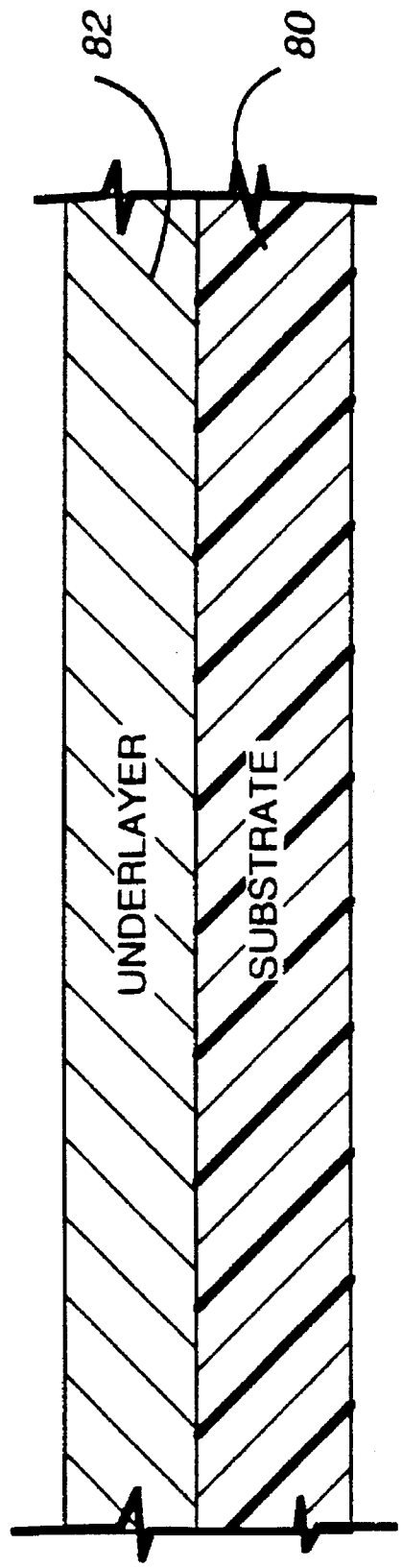
FIG. 3 is an initial cross-sectional ABS view of a possible device fabrication flow for manufacture of a shaped spin valve device as shown, for example, in FIG. 2 illustrating the substrate and overlying underlayer.
Figures 4A, 4B:
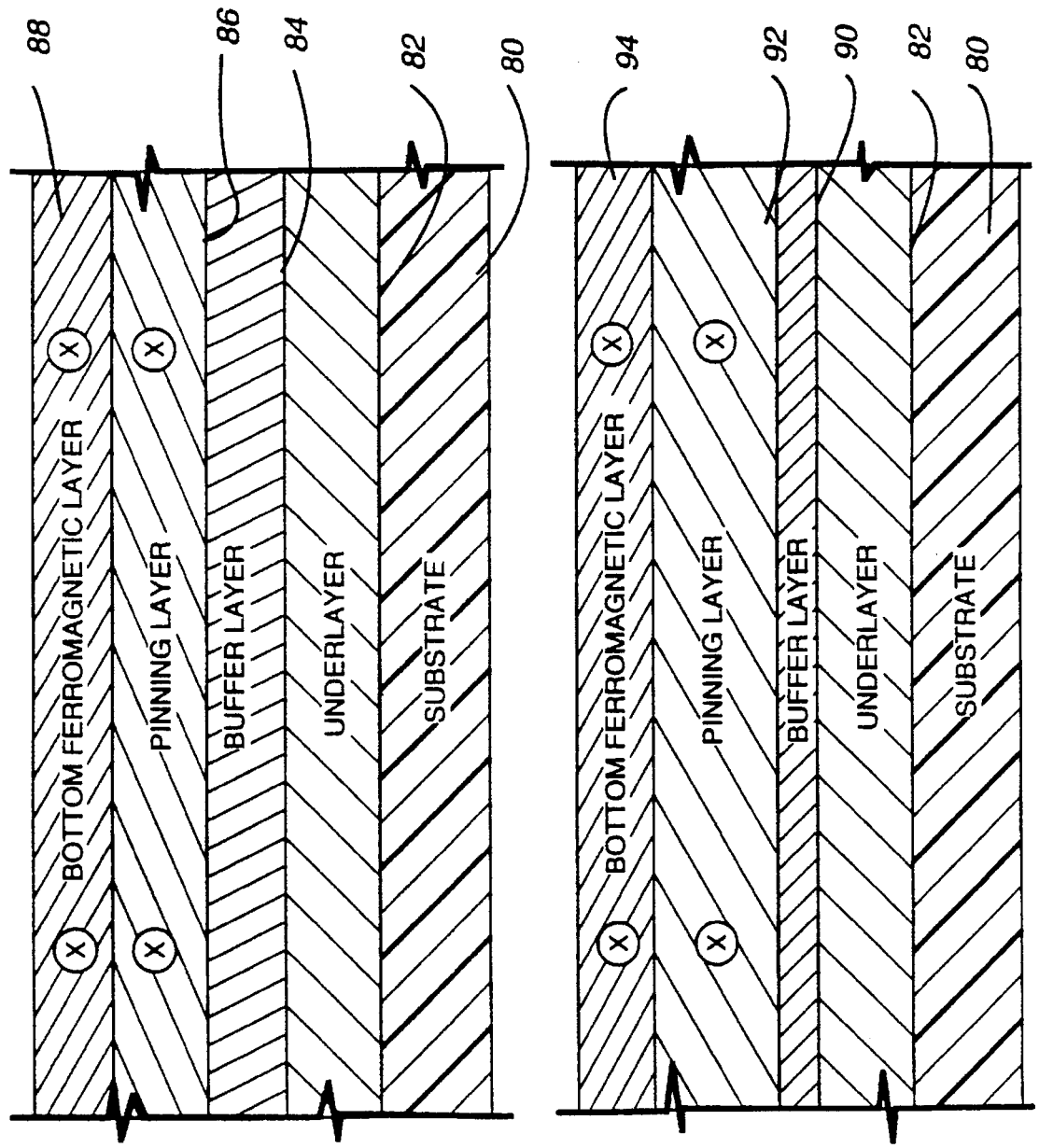
FIGS. 4A–4C are follow-on cross sectional ABS views of the substrate and underlayer depicted in FIG. 3 illustrating alternative fabrication of buffer and pinning layers underlying the bottom ferromagnetic layer in the manufacture of a shaped spin valve device in accordance with the present invention.
Figure 4C:
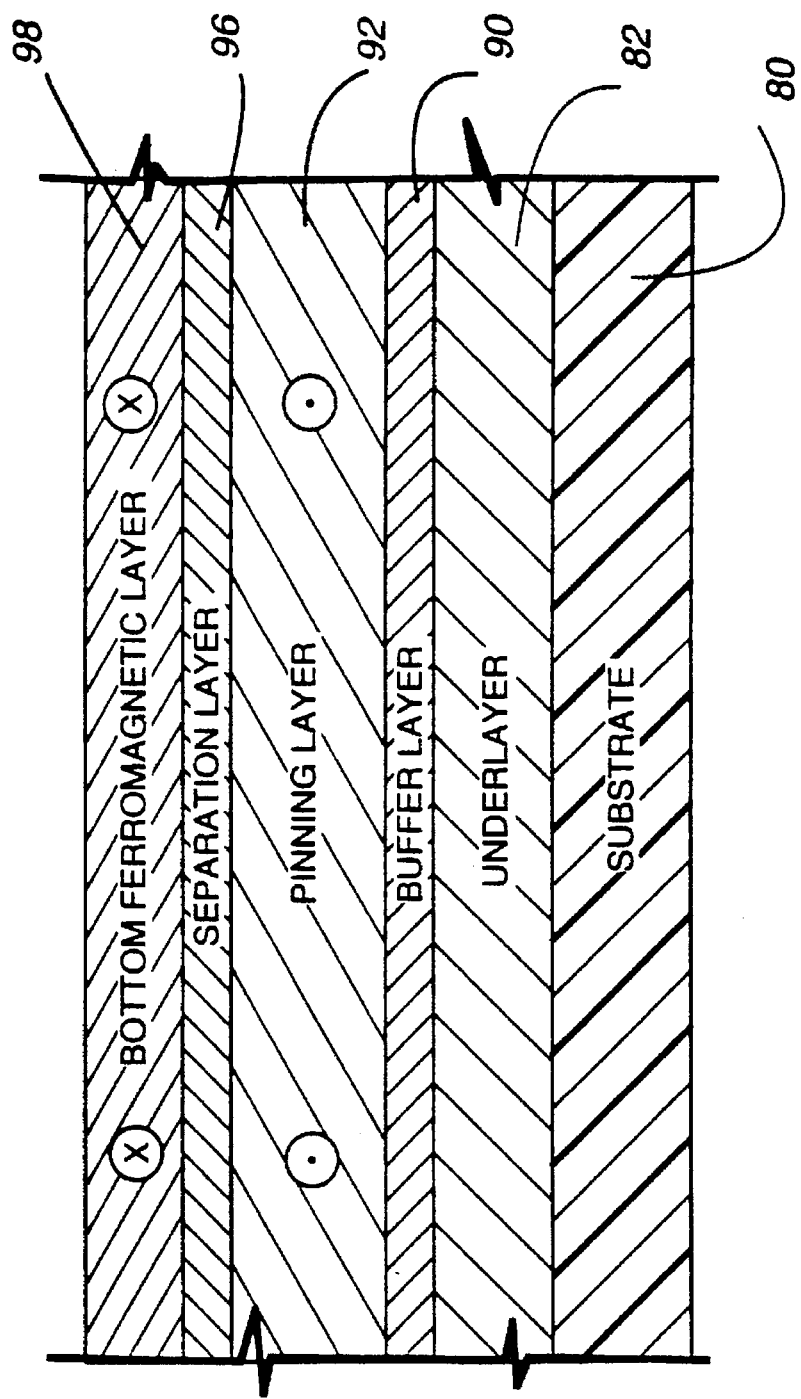

With reference additionally now to FIGS. 4A–4C, various alternative constructions for a pinning layer are illustrated for placement upon the structure previously illustrated in FIG. 3. In FIG. 4A, approximately 50–300 Å of an antiferromagnetic material such as FeMn, NiMn, or NiCoO is utilized as a pinning layer 86 overlying a thin buffer layer 84 such as Cu or NiCr (having a thickness of about 20–500 Å) to promote the proper microstructure and phase of the antiferromagnetic film, particularly where Mn is involved. The buffer layer 84 also functions to prevent interdiffusion between the underlayer 82 and the antiferromagnetic pinning layer 86. The pinning layer 86 underlies a bottom ferromagnetic layer 88 of about 20–200 Å of a transition metal or its alloys having its magmetization direction pinned in a perpendicular direction to the ABS.

With reference to FIG. 4B, magnetic pinning may also be achieved by placing a permanent magnetic pinning layer 92 underneath the ferromagnetic layer to be pinned and overlying a buffer layer 90 which may range from approximately 0–100 Å of Cr. Permanent magnets, such as Co or its alloys, have advantages in this pinning function over Mn-based antiferromagnets (as previously described with respect to FIG. 4A) with respect to material reliability problems such as corrosion resistance. Utilizing this alternative technique, the bottom ferromagnetic layer 94 is exchange coupled with the permanent magnet. Therefore, the magnetization direction of the pinned bottom ferromagnetic layer 94 is parallel to that of permanent magnet pinning layer and both of the directions are perpendicular to the magnetic storage media, or ABS surface.

With reference to FIG. 4C, the bottom ferromagnetic layer 98 and the permanent magnet pinning layer 92 are coupled magnetostatically by placing a nonmagnetic separation layer 96 of about 10–100 Å of Ta or Cr in between them. Utilizing this technique, the magnetization direction of the pinned bottom ferromagnetic layer 98 is antiparallel to that of permanent magnet pinning layer 92, and both of the directions are perpendicular to the media, or ABS surface.

With respect to the alternative pinning techniques shown in FIGS. 4A–4C, the direction of the magnetization can be set in-situ under vacuum conditions or ex-situ, and any transition metal such as Ni, Fe, Co, or its alloys having a thickness of between substantially 20–200 Å can be used for the ferromagnetic layers.

Figure 5:
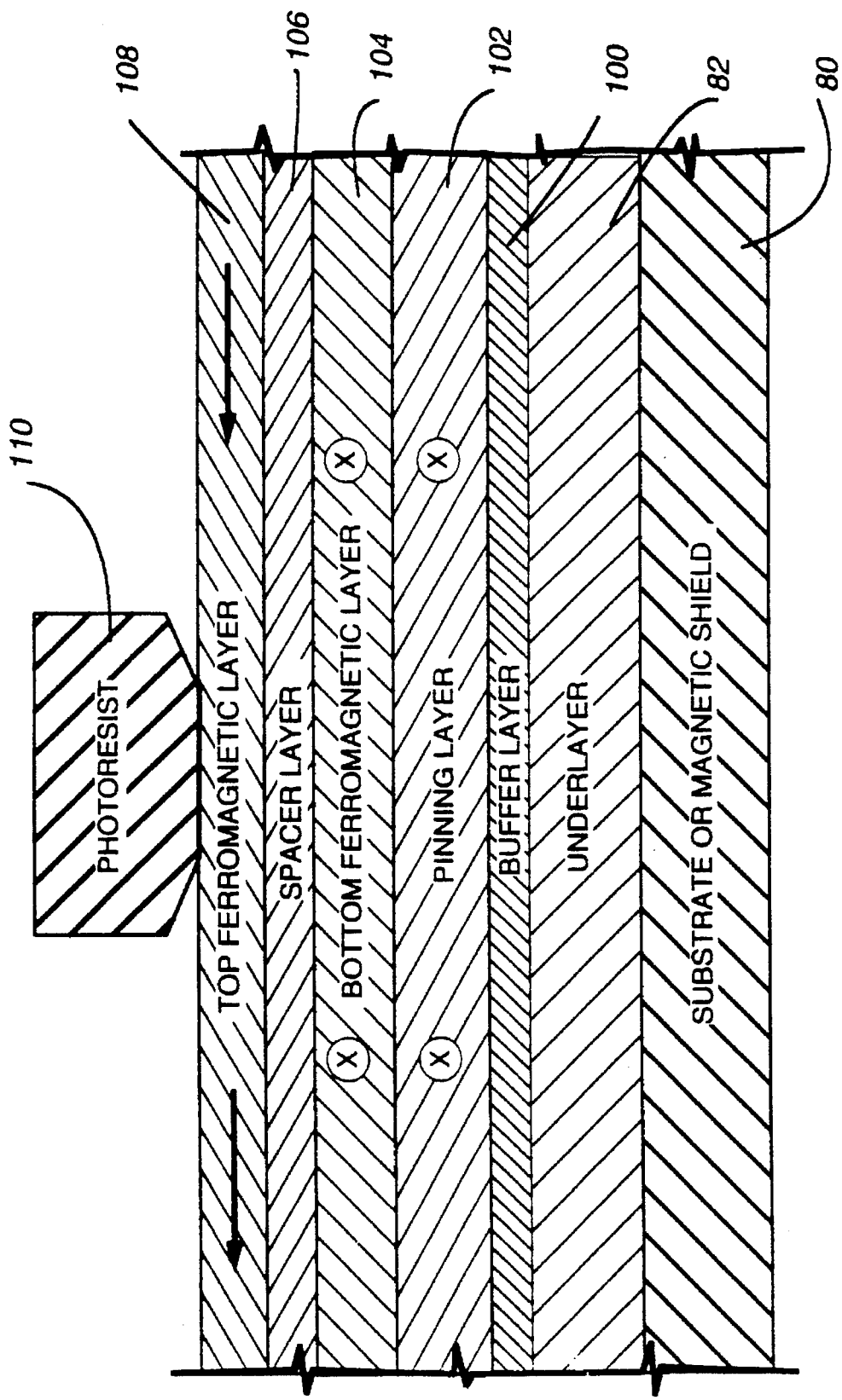
FIG. 5 is an additional follow-on cross sectional ABS view of the structure of FIGS. 4A–4C further illustrating a spacer layer interposed between a top ferromagnetic layer and the pinned, bottom ferromagnetic layer in a self-aligned photolithography process in accordance with the present invention wherein photoresist is patterned on the top ferromagnetic layer to produce a shaped spin valve device.

With reference additionally now to FIG. 5, the spin valve structure may be defined on the substrate 80 and underlayer 82 (if utilized) including a buffer layer 100 (comprising any of the alternative buffer layers 84, 90 described with respect to Figs. 4A–4C) and a pinning layer 102 (comprising any of the alternative pinning layers 86, 92 described with respect to FIGS. 4A–4C). The bottom ferromagnetic layer 104 comprises any of the bottom ferromagnetic layers 88, 94 or 98 above described with respect to FIGS. 4A–4C and may be additionally separated from the pinning layer 102 by a separation layer 96 as previously described.

A spacer layer 106 is then deposited on the bottom ferromagnetic layer 104 and may be provided as a 10–50 Å thick Cu, Ag, Au, or Pd film or their alloys. A top ferromagnetic layer 108 is then deposited on the spacer layer 106 and may also comprise a 20–200 Å thickness of a transition metal such as Ni, Fe, Co, or their alloys. The resultant film structure is patterned with photoresist 110 to define an active spin valve device region as will be more fully described hereinafter.

Figure 6:
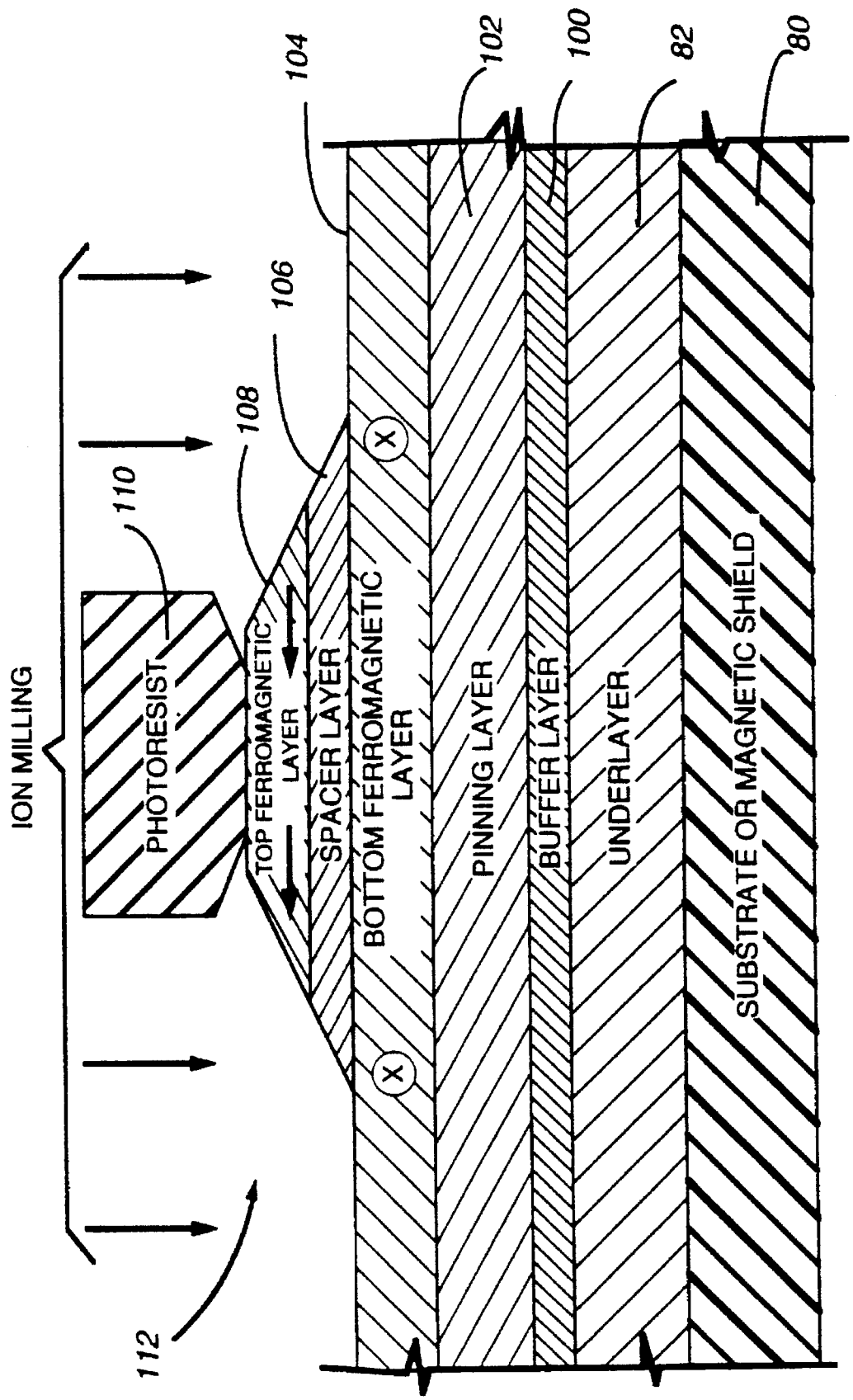
FIG. 6 is an additional follow-on cross sectional ABS view of the structure depicted in FIG. 5 illustrating the formation of a mesa having sloped side portions formed by ion milling of the top ferromagnetic and spacer layers in the area surrounding the patterned photoresist.

With reference additionally to FIG. 6, it can be seen that those upper portions of the film structure comprising the top ferromagnetic layer 108 and underlying spacer layer 106 not covered by the photoresist 110 are etched away by an ion-milling process. Because of the so-called "shadowing effect" provided by the patterned photoresist 110, a tapered mesa-like structure for the active sensor layer comprising the top ferromagnetic layer 108 can be formed. A desirable taper angle for the mesa 112 is an acute angle of substantially 45° or less. In processing, the ion-milling rate is controlled so that the milling operation can stop precisely at the upper surface of the pinned bottom ferromagnetic layer 104. Alternatively, a slight undercut to the pinned bottom ferromagnetic layer 104 can be purposefully formed.

Figure 7:
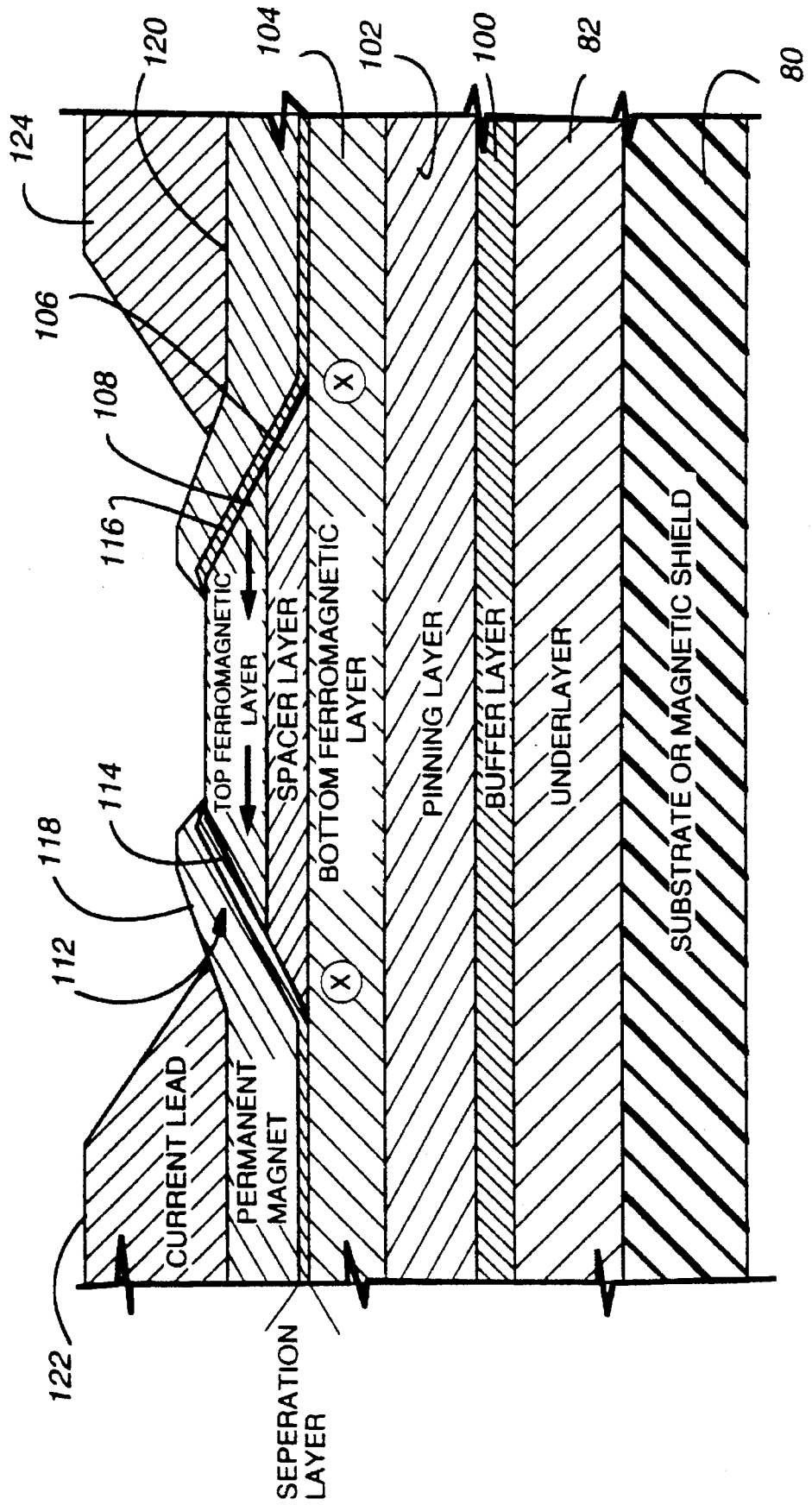
FIG. 7 is an additional follow-on cross sectional ABS view of the structure depicted in FIG. 6 illustrating the addition of relatively thin separation layer portions overlying the sloped side portions of the top ferromagnetic and spacer layer mesa also having overlying permanent magnet layer portions for defining the read track width in addition to a pair of current leads contiguous therewith.

With additional reference to FIG. 7, the subsequent deposition processes for additional permanent magnet layers 118, 120 for domain stabilization purposes, and formation of the conductive current leads 122, 124 is shown. A pair of permanent magnet layers of about 0~500 Å may be deposited directly on top of the tapered side portions of the mesa 112 or deposited after formation of a separation layers 114, 116 (comprising, for example 0~50 Å Cr or other suitable non-magnetic or dielectric material) with the presence of the photoresist 110 shown in FIG. 6. Following the permanent magnet layer 118, 120 deposition, the photoresist is removed. A similar photolithographical process is followed to form the current leads 122, 124. When no permanent magnet layers 118, 120 are needed for domain stabilization of the spin valve sensor, the current leads 122, 124 may be alternatively deposited directly on top of the tapered film structure of the mesa 112.

Figure 8:
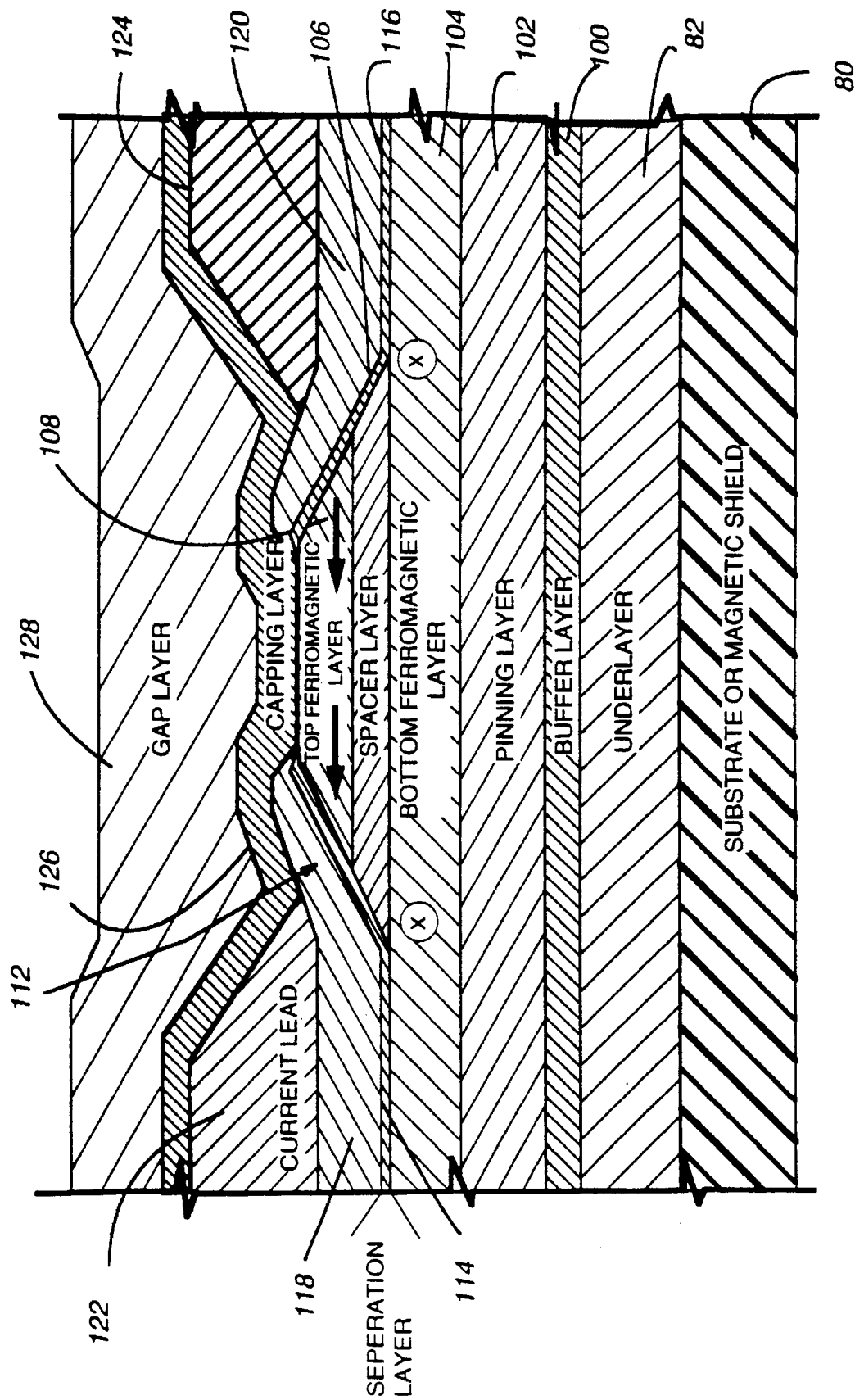
FIG. 8 is a final follow-on cross sectional ABS view of the structure depicted in FIG. 7 illustrating the addition of a capping and gap layer overlying the shaped spin valve device structure.

With additional reference to FIG. 8, the final processing steps are shown which include the deposition of a capping layer 126 and a top gap layer 128. The capping layer 126, which may comprise substantially 0~100 Å of Ta is useful to protect the upper surface of the top ferromagnetic layer 108 in the area not overlain by the permanent magnet layers 118, 120 as well as the permanent magnet layers 118, 120 themselves from the environment. The gap layer 128 may be formed of materials similar to that of the underlayer 82.

What has been provided is a magnetoresistive device, or transducer, and method for manufacturing the same which includes a spin valve structure comprising a pinned, bottom ferromagnetic layer and an active, top ferromagnetic layer separated by a thin nonmagnetic metal spacer layer. The active ferromagnetic layer and underlying spacer layer are formed into a mesa structure having tapered opposing sides to promote better surface planarization in a thin film fabrication process. A pair of permanent magnet layer portions may be deposited at the end portions of the spin valve mesa structure in a generally coplanar relationship to promote domain stabilization and may be separated therefrom by a relatively thin separation layer. The magnetic read track width of the device can be accurately and reproducibly determined by photolithographically defining the spacing between the permanent magnet layer portions overlying the active ferromagnetic layer.

While there have been described above the principles of the present invention in conjunction with specific manufacturing processes, it is to be clearly understood that this description is made only by way of example and not as a limitation to the scope of the invention.

What is claimed is:

1. A process for forming a magnetoresistive device comprising the steps of:
    providing a substrate;
    overlying a pinning layer on said substrate;
    further overlying a first ferromagnetic layer on said pinning layer;
    yet additionally overlying a spacer layer on said first ferromagnetic layer;
    yet further overlying a second ferromagnetic layer on said spacer layer; and
    removing a selected portion of said second ferromagnetic layer and said spacer layer to form a mesa on said first ferromagnetic layer having tapered opposing first and second sides thereof.

2. The process of claim 1 further comprising the step of:
    interposing an underlayer on said substrate between said substrate and said pinning layer.

3. The magnetoresistive device of claim 2 further comprising the step of:
    additionally interposing a buffer layer between said underlayer and said pinning layer.

4. The process of claim 1 further comprising the step of:
    still additionally overlying first and second separation layer portions on said first ferromagnetic layer and said tapered opposing first and second sides of said mesa, said separation layer additionally overlying a selected portion of an upper surface of said second ferromagnetic layer adjacent said tapered opposing first and second sides.

5. The process of claim 4 further comprising the step of:
    still further overlying said first and second separation layer portions with first and second permanent magnet layer portions respectively.

6. The process of claim 5 further comprising the step of:
    also overlying first and second conductor layer portions on a selected portion of said first and second permanent magnet layer portions respectively.

7. The process of claim 6 further comprising the step of:
    also further overlying a capping layer on said first and second conductor layer portions, said first and second permanent magnet layer portions and said upper surface of said mesa between said first and second permanent magnet layer portions.

8. The process of claim 1 wherein said step of providing is carried out by means of a substrate selected from a group consisting of Si, Al$_2$O$_3$-TiC and glass.

9. The process of claim 2 wherein said step of interposing is carried out by means of a material selected from a group consisting of SiO$_2$ and Al$_2$O$_3$.

10. The process of claim 3 wherein said step of additionally interposing is carried out by means of a material selected from a group consisting of Cu and Nicr.

11. The process of claim 1 wherein said step of overlying is carried out by means of an antiferromagnetic material selected from a group consisting of FeMn, NiMn and NiCoO.

12. The process of claim 11 wherein said step of overlying is carried out by means of a permanent magnet material selected from a group consisting of Co and its alloys.

13. The process of claim 1 wherein said step of further overlying is carried out by means of material selected from a group consisting of transition metals and alloys.

14. The process of claim 1 wherein said step of yet additionally overlying is carried out by means of material selected from a group consisting of Cu, Ag, Au, Pd and their alloys.

15. The process of claim 1 wherein said step of yet further overlying is carried out by means of material selected from a group consisting of transition metals and alloys.

16. The process of claim 1 wherein said step of removing comprises the steps of:
    patterning photoresist on said second ferromagnetic layer; and
    ion milling said second ferromagnetic layer and said spacer layer to expose said first ferromagnetic layer.

17. The process of claim 4 wherein said step of still additionally overlying is carried out by means of Cr.

18. The process of claim 5 wherein said step of still further overlying is carried out by means of material selected from a group consisting of Co and its alloys.

19. The process of claim 6 wherein said step of also overlying is carried out by means of material selected from a group consisting of Cu, Aft and Au.

20. The process of claim 7 wherein said step of also further overlying is carried out by means of Ta.

* * * * *